US011079449B2

(12) United States Patent
Shen et al.

(10) Patent No.: US 11,079,449 B2
(45) Date of Patent: Aug. 3, 2021

(54) SYSTEMS AND METHODS FOR MAGNETIC RESONANCE SCANNING

(71) Applicant: SHANGHAI UNITED IMAGING HEALTHCARE CO., LTD., Shanghai (CN)

(72) Inventors: Zhenhua Shen, Shanghai (CN); Qiang He, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 324 days.

(21) Appl. No.: 15/827,116

(22) Filed: Nov. 30, 2017

(65) Prior Publication Data

US 2018/0364317 A1    Dec. 20, 2018

(30) Foreign Application Priority Data

Jun. 16, 2017   (CN) .......................... 201710456025.6

(51) Int. Cl.
    *G01R 33/28*      (2006.01)
    *G01R 33/54*      (2006.01)

(52) U.S. Cl.
    CPC ......... *G01R 33/288* (2013.01); *G01R 33/543* (2013.01)

(58) Field of Classification Search
    CPC ........................... G01R 33/288; G01R 33/543
    USPC ........................................................ 324/309
    See application file for complete search history.

(56) References Cited

U.S. PATENT DOCUMENTS

| 6,407,548 B1 * | 6/2002 | Dietz ................. G01R 33/3854 324/307 |
| 2003/0098687 A1 | 5/2003 | Arneth et al. |
| 2003/0098688 A1 | 5/2003 | Brinker et al. |

(Continued)

FOREIGN PATENT DOCUMENTS

| CN | 104224181 A | 12/2014 |
| CN | 103284723 B | 4/2015 |

(Continued)

OTHER PUBLICATIONS

The extended European search report in European Application No. 17204636.9 dated Jul. 31, 2018, 8 pages.

(Continued)

*Primary Examiner* — Melissa J Koval
*Assistant Examiner* — Courtney G McDonnough
(74) *Attorney, Agent, or Firm* — Metis IP LLC

(57) ABSTRACT

A method for medical imaging may include determining a posture of an object and obtaining a first parameter of a pulse sequence to be applied to the object. The method may also include determining, based on the posture and the first parameter, a SAR distribution model and estimating, based on the SAR distribution model and a second parameter of the pulse sequence to be applied, a SAR distribution associated with the object under the pulse sequence to be applied. The second parameter is associated with calibration of the pulse sequence to be applied. The method may further include determining whether the estimated SAR distribution meets a condition and causing, in response to a result of the determination that the estimated SAR distribution associated with the object meets the condition, a scanner to perform an MR scan on the object according to the pulse sequence.

20 Claims, 10 Drawing Sheets

(56) References Cited

U.S. PATENT DOCUMENTS

| | | | |
|---|---|---|---|
| 2003/0216633 A1* | 11/2003 | Licato | G01R 33/561 |
| | | | 600/410 |
| 2006/0047198 A1 | 3/2006 | Sugimoto | |
| 2007/0276220 A1 | 11/2007 | Harvey et al. | |
| 2012/0262174 A1 | 10/2012 | Voigt et al. | |
| 2015/0268321 A1* | 9/2015 | Zhai | G01R 33/583 |
| | | | 324/309 |
| 2016/0047871 A1 | 2/2016 | Zhou et al. | |
| 2016/0139217 A1* | 5/2016 | Sakuragi | G01R 33/58 |
| | | | 600/415 |
| 2016/0146910 A1* | 5/2016 | Kaneko | A61B 5/748 |
| | | | 324/309 |
| 2016/0178711 A1* | 6/2016 | Chen | G01R 33/288 |
| | | | 324/309 |

FOREIGN PATENT DOCUMENTS

| | | |
|---|---|---|
| CN | 105615882 A | 6/2016 |
| CN | 107137083 A | 9/2017 |
| JP | 2005073975 A | 3/2005 |
| JP | 2009072571 A | 4/2009 |

OTHER PUBLICATIONS

Search report in International Application No. PCT/CN2017/114127 dated Mar. 14, 2018, 5 pages.
Written opinion in International Application No. PCT/CN2017/114127 dated Mar. 14, 2018, 5 pages.
The First Office Action in Chinese Application No. 201710456025.6 dated Dec. 3, 2019, 10 Pages.

\* cited by examiner

SYSTEMS AND METHODS FOR MAGNETIC RESONANCE SCANNING

CROSS-REFERENCE TO RELATED APPLICATIONS

This application claims priority of Chinese Patent Application No. 201710456025.6, filed on Jun. 16, 2017, which is expressly incorporated herein by reference in its entirety.

TECHNICAL FIELD

The present disclosure generally relates to a magnetic resonance (MR) technology, and more particularly, to systems and methods for MR scan.

BACKGROUND

Magnetic resonance (MR) imaging technology is the most popular medical imaging technology for visualizing the internal structure of a human body in radiology. The MR imaging technology is able to perform high-resolution imaging on soft tissue synovial, blood vessel, nerves, muscle, tendon, ligament, transparent cartilage tissue, or the like. During MR imaging, the object can absorb a portion of the radio frequency (RF) energy emitted from the MR imaging device. This may cause body tissue to heating and other side effects including, for example, body burns, vision loss, hearing loss, and nerve function loss. Infants and young children, especially those in severe cases, are more likely to have side effects during MR imaging. Therefore, infants and young children may have a larger limitation when seeking medical treatment.

SUMMARY

According to an aspect of the present disclosure, a system for medical imaging is provided. The system may include a storage device storing a set of instructions and one or more processors in communication with the storage device. When the set of instructions are executed, the one or more processors may be configured to cause the system to implement a method. The method may include determining a posture of an object and obtaining a first parameter of a pulse sequence to be applied to the object. The method may also include determining, based on the posture and the first parameter, a SAR distribution model and estimating, based on the SAR distribution model and a second parameter of the pulse sequence to be applied, a SAR distribution associated with the object under the pulse sequence to be applied. The second parameter is associated with calibration of the pulse sequence to be applied. The method may further include determining whether the estimated SAR distribution meets a condition and causing, in response to a result of the determination that the estimated SAR distribution associated with the object meets the condition, a scanner to perform an MR scan on the object according to the pulse sequence.

In some embodiments, the one or more processors are further configured to cause the system to adjust, in response to a result of the determination that the estimated SAR distribution associated with the object does not meet the condition, the first parameter of the pulse sequence to be applied; and re-determine the SAR distribution associated with the object under the adjusted pulse sequence to be applied.

In some embodiments, the one or more processors may be further configured to cause the system to determine, based on the first parameter of the pulse sequence to be applied and a noise model, noise information of the pulse sequence to be applied; determine whether a maximum noise value in the noise information is equal to or less than a noise threshold; and perform, in response to a result of the determination that the maximum noise value in the noise information is equal to or less than the noise threshold, the MRI scan according to the pulse sequence.

In some embodiments, the one or more processors may be further configured to cause the system to adjust, in response to a result of the determination that the maximum noise value in the noise information is greater than the noise threshold, the first parameter of the pulse sequence to be applied based on a difference between the maximum noise value in the noise information and the noise threshold; and re-determine the noise information of the adjusted pulse sequence to be applied.

In some embodiments, the noise model may be determined based on a gradient combination model of the pulse sequence to be applied, and the gradient combination model may include at least one of a gradient combination model in aspect of different intensities, a gradient combination model in aspect of different periods, or a gradient combination model in aspect of different types.

In some embodiments, the one or more processors may be configured to cause the system to determine the posture of the object. Further, the one or more processors may be configured to cause the system to acquire a scanning image of the object under a preliminary pulse sequence, wherein energy of the preliminary pulse sequence is less than an energy threshold; and determine, based on the scanning image, the posture of the object.

In some embodiments, the one or more processors may be configured to cause the system to determine a specific-absorption rate (SAR) distribution model. Further, the one or more processors may be configured to cause the system to select, based on the posture of the object to be scanned and the first parameter of the pulse sequence to be applied, the SAR distribution model from a SAR distribution database.

In some embodiments, the one or more processors may be further configured to cause the system to determine a plurality of object samples having different ages and/or different postures; perform, according to a plurality of pulse sequences, a plurality of scanning simulations on the plurality of object samples; and determine, based on the plurality of scanning simulations, the SAR distribution database, the SAR distribution database including one or more SAR distribution models.

In some embodiments, the first parameter of the pulse sequence to be applied may include at least one of repetition of time (TR) or flip angle (FA).

In some embodiments, the pulse sequence to be applied may include at least one of a trapezoid pulse or a triangle pulse.

According to an aspect of the present disclosure, a method for for medical imaging is provided. The method may be implemented on at least one machine each of which has at least one processor and storage. The method may include determining a posture of an object and obtaining a first parameter of a pulse sequence to be applied to the object. The method may also include determining, based on the posture and the first parameter, a SAR distribution model and estimating, based on the SAR distribution model and a second parameter of the pulse sequence to be applied, a SAR distribution associated with the object under the pulse sequence to be applied. The second parameter is associated with calibration of the pulse sequence to be applied. The method may further include determining whether the estimated SAR distribution meets a condition and causing, in response to a result of the determination that the estimated SAR distribution associated with the object meets the condition, a scanner to perform an MR scan on the object according to the pulse sequence.

According to another aspect of the present disclosure, a non-transitory computer readable medium is provided. The non-transitory computer readable medium may include executable instructions. When the instructions are executed by at least one processor, the instructions may cause the at least one processor to implement a method. The method may be implemented on at least one machine each of which has at least one processor and storage. The method may include determining a posture of an object and obtaining a first parameter of a pulse sequence to be applied to the object. The method may also include determining, based on the posture and the first parameter, a SAR distribution model and estimating, based on the SAR distribution model and a second parameter of the pulse sequence to be applied, a SAR distribution associated with the object under the pulse sequence to be applied. The second parameter is associated with calibration of the pulse sequence to be applied. The method may further include determining whether the estimated SAR distribution meets a condition and causing, in response to a result of the determination that the estimated SAR distribution associated with the object meets the condition, a scanner to perform an MR scan on the object according to the pulse sequence.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
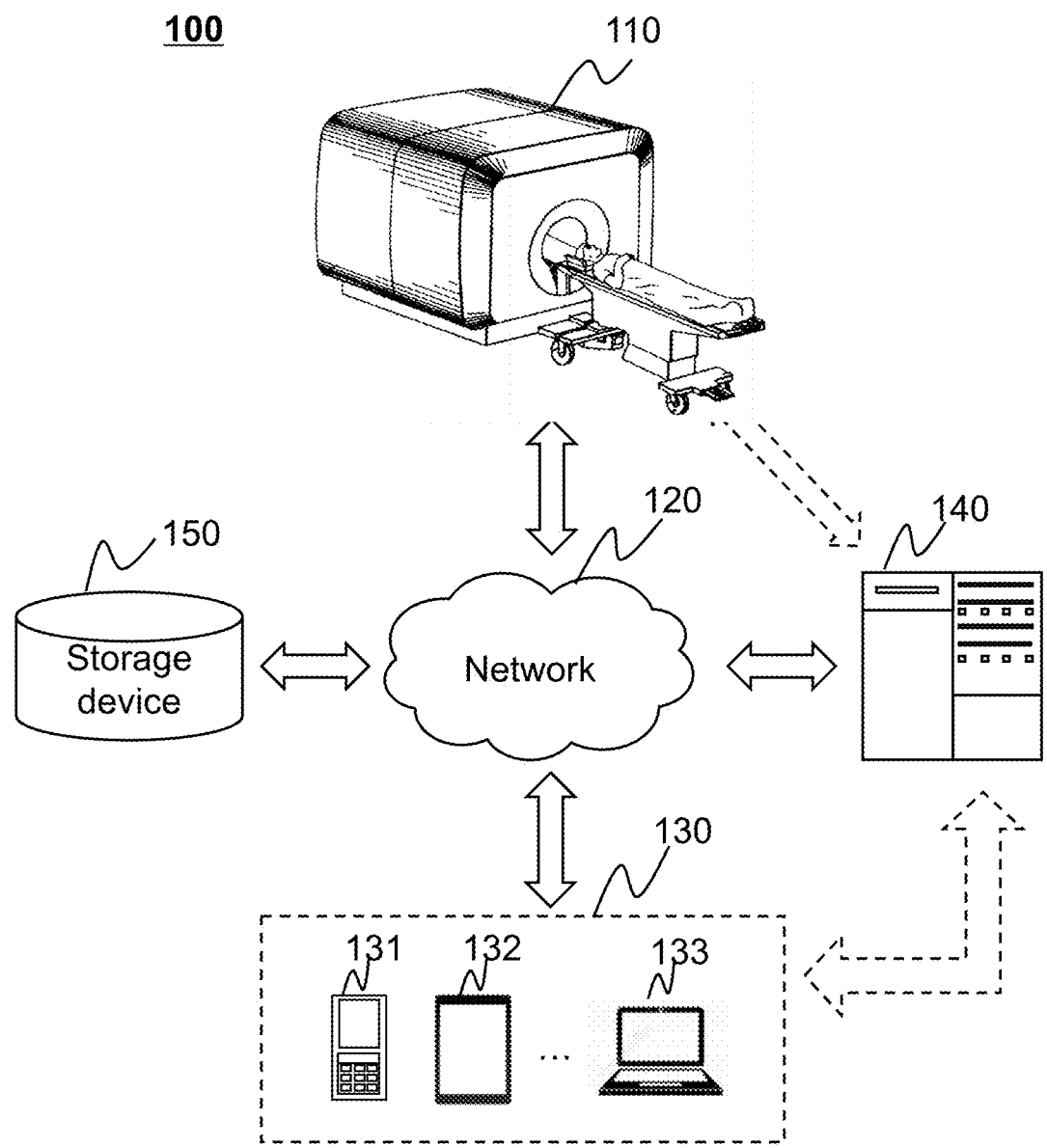
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is to describe particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, section or assembly of different level in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or themselves, and/or may be invoked in response to detected events or interrupts. Software modules/units/blocks configured for execution on computing devices (e.g., processor 210 illustrated in FIG. 2) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may apply to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for illustration and description only and are not intended to limit the scope of the present disclosure. It is understood that the drawings are not to scale.

Provided herein are systems and components for medical imaging, such as for disease diagnosis or research purposes. In some embodiments, the imaging system may include a single modality imaging system and/or a multi-modality imaging system. The single modality imaging system may include, for example, a magnetic resonance imaging (MRI) system. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. It should be noted that the MRI system 100 described below is merely provided for illustration purposes, and not intended to limit the scope of the present disclosure.

For illustration purposes, the present disclosure is directed to systems and methods for medical imaging. In some embodiments, the system may determine a posture of an object to be scanned and obtain a first parameter relating to a pulse sequence relating to the object. The system may also determine a specific absorption rate (SAR) distribution model based on the posture and the first parameter of the pulse sequence. The system may further estimate a SAR distribution associated with the object based on the SAR distribution model and a second parameter relating to the pulse sequence. In some embodiments, the system may determine whether the estimated SAR distribution associated with the object satisfies a condition. If it is determined that the estimated SAR distribution associated with the object satisfies the condition, the system may perform an MR scan according to the pulse sequence. If it is determined that the estimated SAR distribution associated with the object does not satisfy the condition, the system adjusts the first parameter of the pulse sequence.

The following description is provided to help better understanding medical imaging methods and/or systems. This is not intended to limit the scope of the present disclosure. For persons having ordinary skills in the art, a certain amount of variations, changes, and/or modifications may be deducted under the guidance of the present disclosure. Those variations, changes, and/or modifications do not depart from the scope of the present disclosure.

FIG. 1 is a schematic diagram illustrating an exemplary MRI system 100 according to some embodiments of the present disclosure. In some embodiments, the MRI system 100 may be a single modality system. For example, the MRI system 100 may be an MR scanner. In some embodiments, the MRI system 100 may be a multimodality system. For example, the MRI system 100 may be a computed tomography-magnetic resonance (CT-MR) scanner, a magnetic resonance-positron emission tomography (MR-PET) scanner, etc. As shown in FIG. 1, the MRI system 100 may include an MR scanner 110, a network 120, one or more terminals 130, a processing device 140, and a storage device 150. In some embodiments, the MR scanner 110, the terminal 130, the processing device 140, and/or the storage device 150 may be connected to and/or communicate with each other via a wireless connection (e.g., the network 120), a wired connection, or a combination thereof. The connections between the components in the MRI system 100 may vary. Merely by way of example, the MR scanner 110 may be connected to the processing device 140 through the network 120, as illustrated in FIG. 1. As another example, the MR scanner 110 may be connected to the processing device 140 directly. As a further example, the terminal 130 may be connected to the processing device 140 through the network 120, as illustrated in FIG. 1, or connected to the processing device 140 directly (as indicated by the bidirectional arrow in dashed line shown in FIG. 1).

The MR scanner 110 may generate or provide image data associated with MR signals via scanning a subject, or a part of the subject. In some embodiments, the MR scanner 110 may include, for example, a magnetic coil, a gradient coil, a radio frequency (RF) coil, etc. The magnetic body may generate a static magnetic field during the scanning of at least a part of a subject. The gradient coil may provide magnetic gradient field to the main magnetic field. The RF coil may emit radio frequency (RF) pulse signals to and/or receive MR signals from a subject (e.g., a human body) being examined. In some embodiments, the MR scanner 110 may be a permanent magnet MR scanner, a superconducting magnet MR scanner, or a resistive magnet MR scanner, etc., according to types of the magnetic body. In some embodiments, the MR scanner 110 may be a high-field MR scanner, a mid-field MR scanner, or a low-field MR scanner, etc., according to the intensity of the static magnetic field.

The subject may be biological or non-biological. For example, the subject may include a patient, a man-made object, etc. As another example, the subject may include a specific portion, organ, and/or tissue of the patient. For example, the subject may include head, brain, neck, body, shoulder, arm, thorax, cardiac, stomach, blood vessel, soft tissue, knee, feet, or the like, or a combination thereof. In some embodiments, the MR scanner 110 may receive an MR signal related to at least part of the subject.

In some embodiments, the MR scanner 110 may perform a scan on a subject according to a pulse sequence. The pulse sequence may be defined by multiple imaging parameters and arrangement in time sequence corresponding to the multiple imaging parameters. In some embodiments, the imaging parameters may include parameters relating to an RF pulse (e.g., the number of excitations (NEX), a bandwidth, etc.) emitted by the RF coil, parameters relating to gradient fields generated by the gradients coil, and parameters relating to MR signals (e.g., an echo time (TE), an echo train length (ETL), a spin echo type, the number of phases), an acquisition time (TA), a repetition of time (TR), etc. In some embodiments, the pulse sequence may include a spin echo sequence, a gradient echo sequence, a diffusion sequence, an inversion recovery sequence, or the like, or a combination thereof. For example, the spin echo sequence may include a fast spin echo (FSE), a turbo spin echo (TSE), a rapid acquisition with relaxation enhancement (RARE), a half-Fourier acquisition single-shot turbo spin-echo (HASTE), a turbo gradient spin echo (TGSE), or the like, or a combination thereof.

The network 120 may include any suitable network that can facilitate the exchange of information and/or data for the MRI system 100. In some embodiments, one or more components of the MRI system 100 (e.g., the MR scanner 110, the terminal 130, the processing device 140, the storage device 150) may communicate information and/or data with one or more other components of the MRI system 100 via the network 120. For example, the processing device 140 may obtain image data from the MR scanner 110 via the network 120. As another example, the processing device 140 may obtain user instructions from the terminal 130 via the network 120. The network 120 may be a public network (e.g., the Internet), a private network (e.g., a local area network (LAN), a wide area network (WAN)), a wired network (e.g., an Ethernet network), a wireless network (e.g., an 802.11 network, a Wi-Fi network), a cellular network (e.g., a Long Term Evolution (LTE) network), a frame relay network, a virtual private network (VPN), a satellite network, a telephone network, routers, hubs, switches, server computers, or the like, or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the MRI system 100 may be connected to the network 120 to exchange data and/or information.

The terminal(s) 130 may include a mobile device 131, a tablet computer 132, a laptop computer 133, etc. In some embodiments, the mobile device 131 may include a smart home device, a wearable device, a mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, footgear, eyeglasses, a helmet, a watch, clothing, a backpack, a smart accessory, or the like, or any combination thereof. In some embodiments, the mobile device may include a mobile phone, a personal digital assistant (PDA), a gaming device, a navigation device, a point of sale (POS) device, a laptop, a tablet computer, a desktop, or the like, or any combination thereof. In some embodiments, the virtual reality device and/or the augmented reality device may include a virtual reality helmet, virtual reality glasses, a virtual reality patch, an augmented reality helmet, augmented reality glasses, an augmented reality patch, or the like, or any combination thereof. For example, the virtual reality device and/or the augmented reality device may include a Google Glass™, an Oculus Rift™, a HoloLens™, a Gear VR™, etc. In some embodiments, the terminal 130 may be part of the processing device 140.

The processing device 140 may process data and/or information obtained from the MR scanner 110, the terminal 130, and/or the storage device 150. For example, the processing device 140 may generate an MR image by processing image data (e.g., MR signals) collected by the MR scanner 110. As another example, the processing device 140 may determine a SAR distribution associated with a subject based on a pulse sequence. As still an example, the processing device 140 may assess and/or adjust the pulse sequence based on the SAR distribution associated with the subject. In some embodiments, the processing device 140 may be a computer, a user console, a single server, a server group, etc. The server group may be centralized or distributed. In some embodiments, the processing device 140 may be local or remote. For example, the processing device 140 may access information and/or data stored in the MR scanner 110, the terminal 130, and/or the storage device 150 via the network 120. As another example, the processing device 140 may be directly connected to the MR scanner 110, the terminal 130, and/or the storage device 150 to access stored information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented by a computing device 200 having one or more components illustrated in FIG. 2.

The storage device 150 may store data, instructions, and/or any other information. In some embodiments, the storage device 150 may store data obtained from the MR scanner 110, the terminal 130, and the processing device 140. In some embodiments, the storage device 150 may store data and/or instructions that the processing device 140 may execute or use to perform exemplary methods described in the present disclosure. In some embodiments, the storage device 150 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random-access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more other components of the MRI system 100 (e.g., the processing device 140, the terminal 130). One or more components of the MRI system 100 may access the data or instructions stored in the storage device 150 via the network 120. In some embodiments, the storage device 150 may be directly connected to or communicate with one or more other components of the MRI system 100 (e.g., the processing device 140, the terminal 130). In some embodiments, the storage device 150 may be part of the processing device 140.

Figure 2:
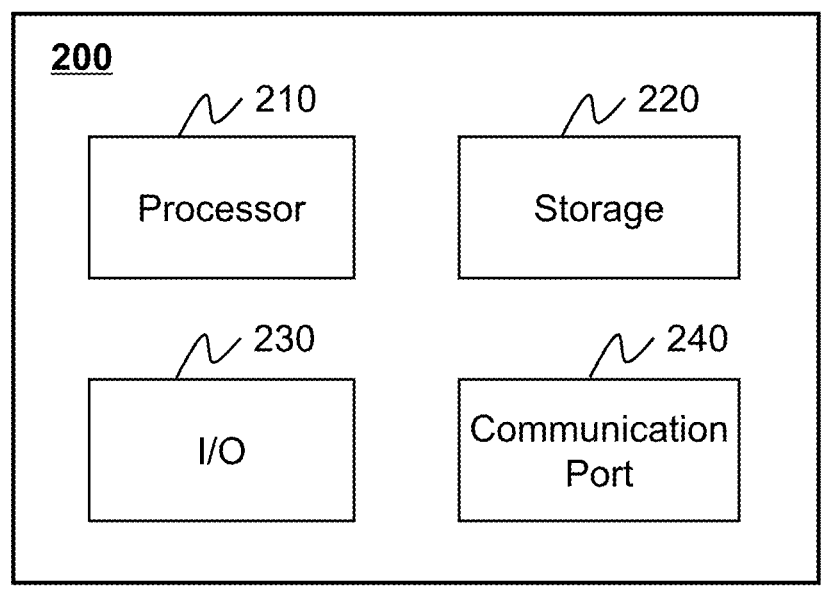
FIG. 2 is a schematic diagram illustrating hardware and/or software components of an exemplary computing device according to some embodiments of the present disclosure.

FIG. 2 is a schematic diagram illustrating hardware and/or software components of an exemplary computing device 200 on which the processing device 140 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (e.g., program code) and perform functions of the processing device 140 in accordance with techniques described herein. The computer instructions may include, for example, routines, programs, objects, components, data structures, procedures, modules, and functions, which perform functions described herein. For example, the processor 210 may process image data obtained from the MR scanner 110, the terminal 130, the storage device 150, and/or any other component of the MRI system 100. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both step A and step B, it should be understood that operation A and operation B may also be performed by two or more different processors jointly or separately in the computing device 200 (e.g., a first processor executes step A, and a second processor executes operation B, or the first and second processors jointly execute operations A and B).

The storage 220 may store data/information obtained from the MR scanner 110, the terminal 130, the storage device 150, and/or any other component of the MRI system 100. In some embodiments, the storage 220 may include a mass storage, removable storage, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random-access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program for the processing device 140 for determining a regularization item.

The I/O 230 may input and/or output signals, data, information, etc. In some embodiments, the I/O 230 may enable a user interaction with the processing device 140. In some embodiments, the I/O 230 may include an input device and an output device. Examples of the input device may include a keyboard, a mouse, a touch screen, a microphone, or the like, or any combination thereof. Examples of the output device may include a display device, a loudspeaker, a printer, a projector, or the like, or any combination thereof. Examples of the display device may include a liquid crystal display (LCD), a light-emitting diode (LED)-based display, a flat panel display, a curved screen, a television device, a cathode ray tube (CRT), a touch screen, or the like, or any combination thereof.

The communication port 240 may be connected to a network (e.g., network 120) to facilitate data communications. The communication port 240 may establish connections between the processing device 140 and the MR scanner 110, the terminal 130, and/or the storage device 150. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMAX™ link, a WLAN link, a ZigBee link, a mobile network link (e.g., 3G, 4G, 5G), or the like, or any combination thereof. In some embodiments, the communication port 240 may be and/or include a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
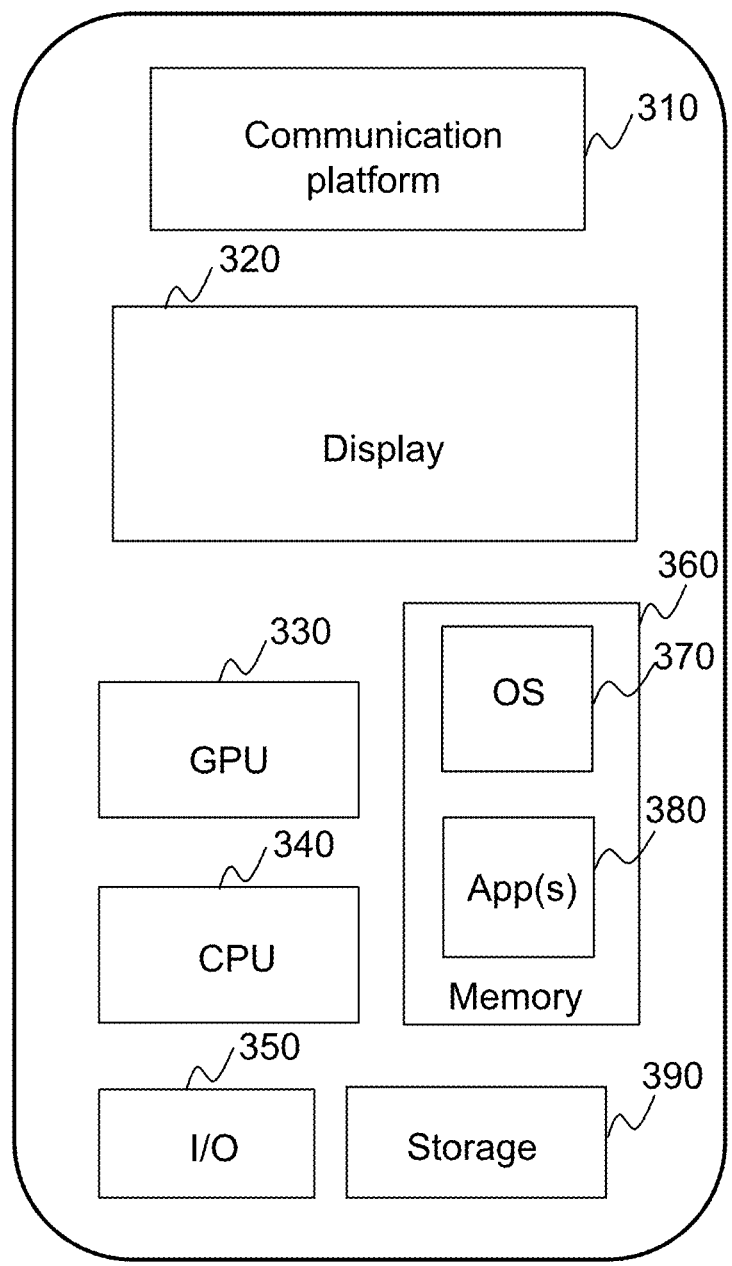
FIG. 3 is a schematic diagram illustrating hardware and/or software components of an exemplary mobile device according to some embodiments of the present disclosure.

FIG. 3 is a schematic diagram illustrating hardware and/or software components of an exemplary mobile device on which the terminal 130 may be implemented according to some embodiments of the present disclosure. As illustrated in FIG. 3, the mobile device 300 may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system (OS) 370 (e.g., iOS™, Android™, Windows Phone™) and one or more applications 380 may be loaded into the memory 360 from the storage 390 to be executed by the CPU 340. The applications 380 may include a browser or any other suitable mobile apps for receiving and rendering information relating to image processing or other information from the processing device 140. User interactions with the information stream may be achieved via the I/O 350 and provided to the processing device 140 and/or other components of the MRI system 100 via the network 120.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal device. A computer may also act as a server if appropriately programmed.

Figure 4:
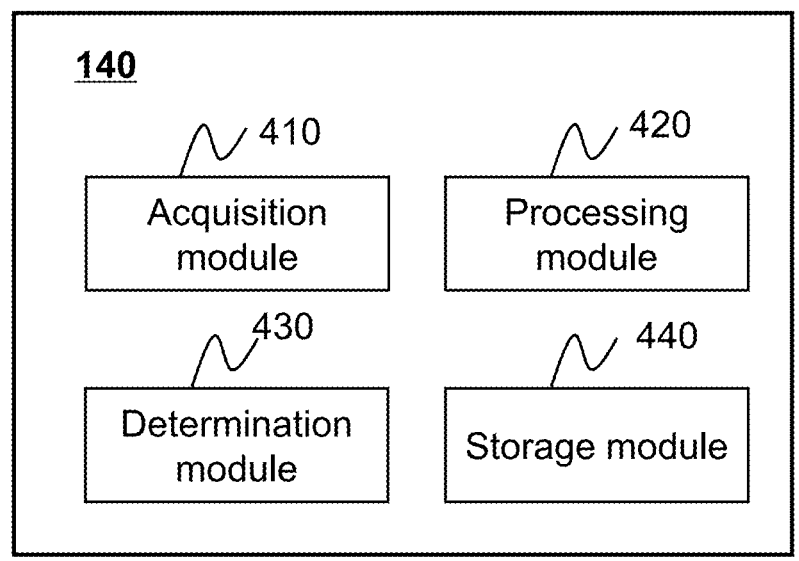
FIG. 4 is a block diagram illustrating an exemplary processing device according to some embodiments of the present disclosure.

FIG. 4 is a block diagram illustrating an exemplary processing device according to some embodiments of the present disclosure. The processing device 140 may include an acquisition module 410, a processing module 420, a determination module 430, and a storage module 440. Generally, the terms "module," "unit," and/or "engine" used herein, refers to logic embodied in hardware or firmware, or to a collection of software instructions. The modules, units, and engines described herein may be implemented as software and/or hardware modules and may be stored in any type of non-transitory computer-readable medium or another storage device. In some embodiments, a software module may be compiled and linked into an executable program. It will be appreciated that software modules can be callable from other modules or themselves, and/or can be invoked in response to detected events or interrupts. Software modules configured for execution on computing devices (e.g., the processor 210 of the computing device 200 and/or the CPU 340 of the mobile device 300) can be provided on a computer-readable medium, such as a compact disc, a digital video disc, a flash drive, a magnetic disc, or any other tangible medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedded in firmware, such as an EPROM. It will be further appreciated that hardware modules can be included of connected logic units, such as gates and flip-flops, and/or can be included of programmable units, such as programmable gate arrays or processors. The modules or computing device functionality described herein are preferably implemented as software modules but can be represented in hardware or firmware. In general, the modules described herein refer to logical modules that can be combined with other modules or divided into sub-modules despite their physical organization or storage.

The acquisition module 410 may acquire data or instructions from other components of the MRI system 100. In some embodiments, the acquisition module 410 may acquire data from the MR scanner 110. For example, the acquisition module 410 may acquire a posture of the object to be scanned from the MR scanner 110. As another example, the acquisition module 410 may acquire an MR image of the object from the MR scanner 110.

In some embodiments, the acquisition module 410 may acquire data from the storage module 440, the terminal 130, the storage device 150, etc. For example, the acquisition module 410 may acquire a pulse sequence to be applied from the storage module 440, the terminal 130, the storage device 150, etc. The pulse sequence may include a plurality of parameters. As another example, the acquisition module 410 may acquire models from the storage module 440, the terminal 130, the storage device 150, etc. The models may include a specific-absorption rate (SAR) distribution model, a noise model, or the like. The SAR distribution model may refer to a model including SAR distributions on the body of the object. As another example, the acquisition module 410 may acquire a SAR distribution database from the storage module 440, the terminal 130, the storage device 150, etc. The SAR distribution database may include a plurality of SAR distribution models. As another example, the acquisition module 410 may acquire historical data from the storage module 440, the terminal 130, the storage device 150, etc. The historical data may include scanning parameters and/or personal information of a plurality of objects. The personal information may include gender, age, weight, height, or the like. The scanning parameters may include scanning part, posture, pulse sequence type, repetition of time (TR), flip angle (FA), transmission mode, or the like. As another example, the acquisition module 410 may acquire instructions from the storage module 440.

In some embodiments, the acquisition module 410 may acquire data provided by the operator. For example, the operator may enter the pulse sequence to be applied to the acquisition module 410 based on experience. As another example, the operator may enter a SAR distribution model to the acquisition module 410.

The processing module 420 may process the information provided by various components or modules of the MRI system 100. The processing module 420 may process the data acquired by acquisition module 410, the data retrieved from the storage module 440, etc. In some embodiments, according to the data acquired by the acquisition module 410, the processing module 420 may generate various operation instructions. For example, the processing module 420 may determine a SAR distribution model based on the pulse sequence to be applied and the posture of the object acquired by the acquisition module 410. As another example, the processing module 420 may estimate a SAR distribution associated with the object to be scanned based on acquired and/or processed data. As another example, the processing module 420 may determine the posture of the object to be scanned based on the scanning image of the object. As another example, the processing module 420 may generate models based on data acquired by the acquisition module 410. The models may include a SAR distribution model, a noise model, or the like. As another example, the processing module 420 may adjust the pulse sequence to be applied.

The determination module 430 may determine whether an MR scan is safe to be performed on the object. In some embodiments, the determination module 430 may determine whether the SAR distribution associated with the object meets a condition. For example, whether the energy of the SAR distribution associated with the object to be scanned is safe to the object may be determined. In some embodiments, the determination module 430 may determine whether the maximum noise value generated by the pulse sequence to be applied is less than or equal to a noise threshold.

In some embodiments, the determination module 430 may transmit the determination result to the MR scanner 110 or the processing module 420. For example, in response to the determination that the MR scan is safe to be performed on the object, the determination module 430 may transmit the determination result to the MR scanner 110. In response to the determination that the MR scan is unsafe to be performed on the object, the determination module 430 may transmit the determination result to the processing module 420.

The storage module 440 may store data and/or instructions. In some embodiments, the storage module 440 may store the data and/or instructions transmitted from the acquisition module 410, the processing module 420, the determination module 430, or the like. The data may include historical scanning data, SAR distribution models, SAR distribution database, noise models, parameters, MR images, or the like, or any combination thereof. In some embodiments, the storage module 440 may store one or more programs and/or instructions that may be executed by the processing module 420 of processing device 140 to perform exemplary processes or methods described in this disclosure. For example, the storage module 440 may store program(s) and/or instruction(s) that can be executed by the processing module 420 of the processing device 140 to acquire a SAR distribution associated with the object to be scanned, noise information of the pulse sequence to be applied, and/or any intermediate result.

Figure 5:
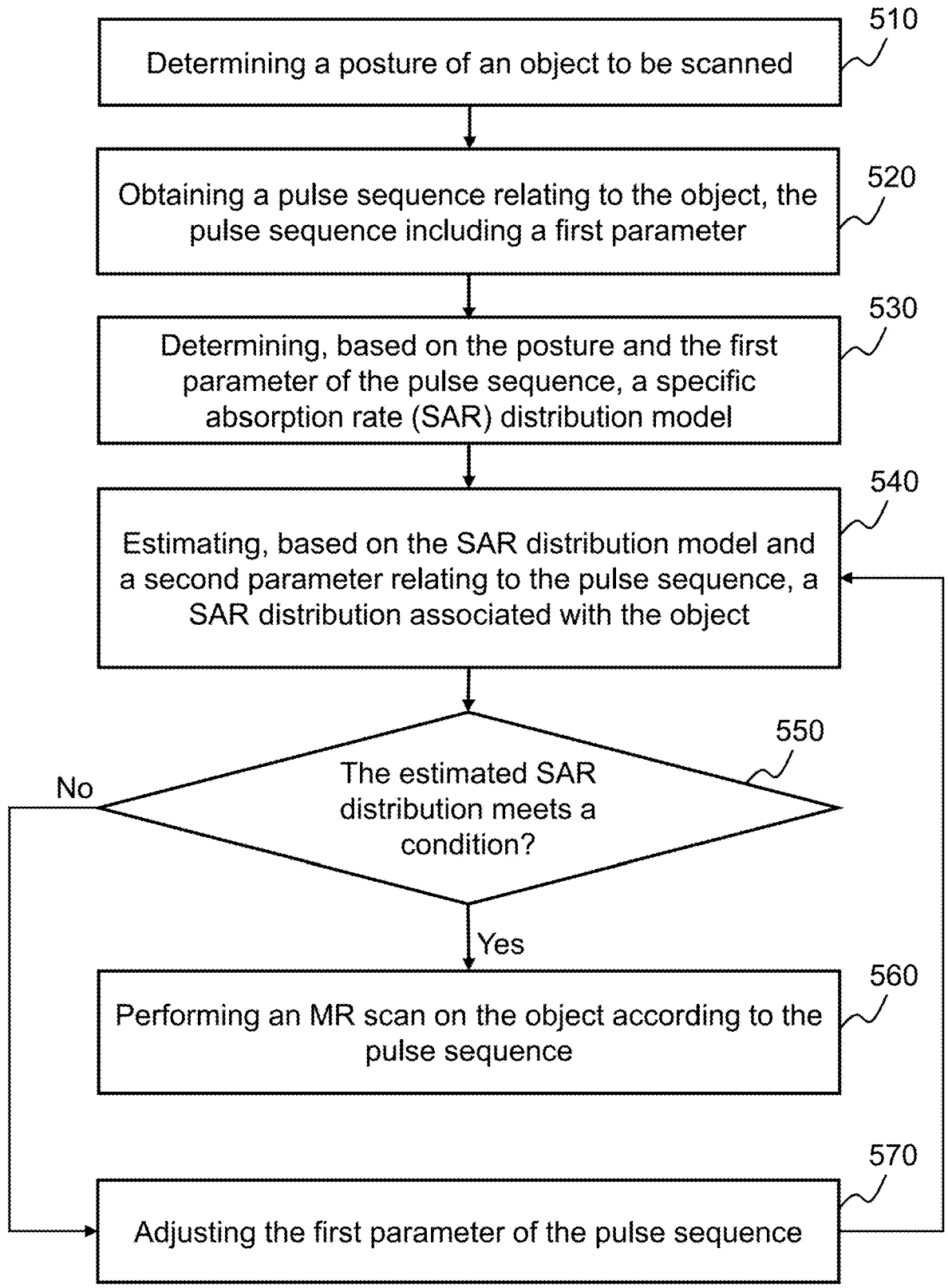
FIG. 5 is a flowchart illustrating an exemplary process for scanning an object using the MRI system according to some embodiments of the present disclosure.

FIG. 5 is a flowchart illustrating an exemplary process 500 for scanning an object using the MRI system according to some embodiments of the present disclosure. Process 500 may be implemented in the MRI system 100 illustrated in FIG. 1. For example, process 500 may be stored in the storage device 150 and/or the storage 220 in the form of instructions (e.g., an application), and invoked and/or executed by the processing device 140 (e.g., the processor 210 illustrated in FIG. 2 or one or more modules in the processing device 140 illustrated in FIG. 4). The operations of the illustrated process presented below are intended to be illustrative. In some embodiments, process 500 may be accomplished with one or more additional operations not described, and/or without one or more of the operations discussed. Additionally, the order in which the operations of process 500 as illustrated in FIG. 5 and described below is not intended to be limiting.

In 510, a posture of an object to be scanned (also referred to herein as an object) may be determined. Operation 510 may be performed by the acquisition module 410. The posture of the object may include a supine position, a recovery position, or the like. The object to be scanned may refer to an object to have a magnetic resonance (MR) scanning. The object may be a child, an adult, an imaging model, an animal, or the like. In some embodiments, the acquisition module 410 may determine the supine position of the object. The supine position of the scanned subject may refer to a posture of the scanned subject under an MR scan in the scanning bed. For a child or an adult, the supine position may include but not limited to: a standard supine position with two legs being fully extended and two hands being put aside the body, two legs being folded or bent, two arms being bent or put upon the body, or the like. Herein, the arms being put upon the body may refer to the arms being put to the abdomen, the breast, or other body parts. For example, the acquisition module 410 may determine that the object has a standard supine position of the object with two legs being fully extended.

In some embodiments, the acquisition module 410 may determine a scanning image of the object to be scanned based on a preliminary pulse sequence. The acquisition module 410 or the processing module 420 may further determine the posture of the object to be scanned based on the scanning image. In some embodiments, the preliminary pulse sequence may be used to perform a quick positioning on the object to be scanned. The preliminary pulse sequence may be low-energy and fast. For example, the energy of the preliminary pulse sequence may be less than a predetermined energy threshold. The predetermined energy threshold may be an energy threshold safe for the object to be scanned. One or more parameters of the preliminary pulse sequence may be determined according to the predetermined energy threshold. By scanning the object under the preliminary pulse sequence, the posture of the object may be determined. The preliminary pulse sequence may be used to obtain the scanning image that may be applied to determine the posture of the object and may be not used to perform a pathological examination of the object. This may also avoid the installment of one or more image acquisition devices (e.g., a camera), thereby reducing the cost.

In 520, a pulse sequence may be obtained, which may include a first parameter and relate to the object. Operation 520 may be performed by the acquisition module 410. The pulse sequence relating to the object may be defined by multiple imaging parameters (also referred herein as to pulse sequence parameters) and arrangement in time sequence corresponding to the multiple imaging parameters as described elsewhere in the present disclosure (e.g., FIG. 1 and description thereof). The first parameter may include a pulse sequence parameter relating to radio frequency (RF) pulses applied to scan the object. Exemplary pulse sequence parameters relating to RF pulses (i.e., the first parameter) may include a bandwidth of RF pulse (also referred to herein as a frequency range), an amplitude or strength of RF pulse, a time for applying the RF pulse, a duration for applying the RF pulse, a transmission mode, a repetition of time (TR), a flip angle (FA) of RF pulse, or the like, or a combination thereof. The transmission mode may include circularly polarized or elliptically polarized.

In some embodiments, the pulse sequence relating to the object may be obtained from the MR scanner 110, the terminal 130, the storage device 150, or any other external storage. In some embodiments, at least one portion of the pulse sequence (e.g., at least one portion of the first parameter) may be designed and/or determined according to clinical demands or a scanning protocol before an MRI process. For example, at least one portion of the pulse sequence may be set by a user manually via the terminal 130 according to clinical demands, for example, according to the posture of the object obtained in 510. As another example, at least one portion of the pulse sequence may be set the processing device 140 automatically according to a scanning protocol.

In 530, a SAR distribution model may be determined based on the determined posture of the object and the first parameter of the pulse sequence. Operation 530 may be performed by the processing module 420. A SAR distribution model may be used to determine or estimate a distribution of SARs in different portions of a body (e.g., the object). A SAR distribution model may relate to characteristics of a body (such as age, weight, height, posture, etc.), a type of a pulse sequence, a pulse sequence parameter, or the like, or a combination thereof. For example, different bodies (e.g., a child, an adult, etc.) may correspond to different SAR distribution models. Different pulse sequences may correspond to different SAR distribution models. Further, SARs determined based on a SAR distribution model may relate to a pulse sequence parameter of a pulses sequence. For example, with other parameters unchanged and only the repetition of time changed, the greater the repetition of time (TR) is, the lower the average SAR may be. As another example, the smaller the flip angle of RF pulses, the lower the SAR may be.

The SAR distribution model may be a three-dimensional (3D) body model, a two-dimensional (2D) body model, or the like. The SAR distribution model may be monochrome or chromatic. In some embodiments, the processing module 420 may generate a SAR distribution model based on the posture and the first parameter of the pulse sequence to be applied according to the Computer Simulation Technology (CST), for example, a finite difference time domain (FDTD) technology, a finite volume (FOV) technology, a finite element (FEM) technology, or the like, or a combination. In some embodiments, the processing module 420 may determine the SAR distribution model from a SAR distribution database according to the posture of the object and the first parameter of the pulse sequence. The SAR distribution database may include a plurality of reference SAR distribution models (e.g., Model 1, Model 2, . . . , Model 4 as shown in Table 1) and multiple scanning conditions relating to the plurality of reference SAR distribution models (e.g., Model 1, Model 2, . . . , Model 4 as shown in Table 1). Each of the plurality of reference SAR distribution models may correspond to one of the multiple scanning conditions. A scanning condition may be defined by, for example, a characteristic relating to a body (e.g., weight, age, height, supine position, scanning portion of the body, etc.), a parameter of a pulse sequence (e.g., a flip angle, a repetition of time, a transmission mode, etc.), a type of a pulse sequence (e.g., a fast spin echo (FSE) sequence, a planar echo imaging (EPI) sequence, a gradient echo (GRE) sequence, etc.), or the like, or a combination. For example, in Table 1, Model 1 may correspond to a scanning condition including that age is one month, height is 55 cm, weight is 5 kg, scanning portion is abdomen, supine position of is leg being folded, the type of pulse sequence is FSE sequence, TR is 2700 ms, flip angle is 150 degree, transmission mode is elliptically polarized scanning.

The reference SAR distribution models included in the SAR distribution database may be determined based on a computer simulation technology (CTS). Further, multiple scanning data (i.e., MR signals) corresponding to different scanning conditions as described above may be obtained. The reference SAR distribution models may be estimated via performing MRI scanning simulations with different pulse sequence parameters according to the multiple scanning data. Thus, the reference SAR distribution models corresponding to different scanning conditions may be determined.

The SAR database may realize accurate prediction of the SAR distribution on the object to be scanned, improving the safety of the object to be scanned, especially the safety of a child to be scanned. As shown in Table 1, a local SAR distribution database in the aspect of the supine position is shown.

TABLE 1

| A local SAR distribution database | | | | |
|---|---|---|---|---|
| Model | Model 1 | Model 2 | Model 3 | Model 4 |
| Age | 1 month | 3 months | 1 year old | 3 years old |
| Height (cm) | 55 | 62 | 76 | 94 |
| Weight (kg) | 5 | 6.7 | 10 | 15 |
| Scanning part | Abdomen | Head | Pelvic | Head |
| Supine position | Bent legs | Arms on breast | Bent legs | Supine position |

TABLE 1-continued

| A local SAR distribution database | | | | |
|---|---|---|---|---|
| Model | Model 1 | Model 2 | Model 3 | Model 4 |
| Pulse sequence type | FSE | FSE | FSE | EPI |
| TR (ms) | 2700 | 600 | 3000 | 2700 |
| FA (°) | 150 | 150 | 150 | 180 |
| Transmission mode | Elliptically polarized | Circularly polarized | Elliptically polarized | Elliptically polarized |

The SAR distribution model may be selected from the SAR distribution database based on a scanning condition corresponding to the object, for example, the posture of the object determined in 510, the first parameter of the pulse sequence relating to the object obtained in 520, etc.

In 540, a SAR distribution associated with the object may be estimated based on the SAR distribution model and a second parameter relating to the pulse sequence. Operation 540 may be performed by the processing module 420. The SAR distribution associated with the object may include multiple SARs corresponding to different portions of the object when multiple RF pulses corresponding to the pulse sequence obtained in 520 are applied to the object. The SAR distribution model may represent ratios of different SARs corresponding to different portions of the object to a total RF pulse energy corresponding to the pulse sequence. Further, the SAR distribution associated the object may be determined based on the SAR distribution model and the total RF pulse energy corresponding to the pulse sequence. For example, a SAR on a specific part of the object to be scanned may be determined based on the product of the ratio of the SAR corresponding to the specific part of the object and the total RF pulse energy. The SAR distribution of the object may include overall SAR distribution and a local SAR distribution. The overall SAR distribution may be determined by dividing the total energy entering the object by the weight of the object. The local SAR distribution may be determined based on the overall SAR distribution and the SAR distribution model. An exemplary SAR distribution associated with the object may be shown in FIG. 7. As used herein, the total RF pulse energy may refer to the energy of RF pulses entering a scanning region of an imaging device (e.g., the MR scanner 110). The total RF pulse energy may be absorbed by RF coils or the object when the object is being scanned.

In some embodiments, the total RF pulse energy may be determined based on the second parameter relating to the pulse sequence. As used herein, the second parameter relating to the pulse sequence may refer to a scanning parameter relating to the generation of RF pulses. For example, the second parameter relating to the pulse sequence may include an emission voltage of RF pulses, an emission frequency of RF pulses, a forward transmission coefficient, a reflection coefficient, etc. The forward transmission coefficient may refer to a ratio between the input energy of a next level in the radio frequency chain and the input energy of the last level. The reflection coefficient may refer to a ratio between the reflection energy and the input energy. Further, the total RF pulses energy may be determined based on input energy of RF pulses and reflection energy of RF pulses. For example, the total energy of RF pulses may be determined by subtracting the reflection energy from the input energy. As used herein, the input energy of RF pulses may refer to an original energy of RF pulses when the RF pulses generate in an RF chain. The reflection energy of RF pulses may refer to the energy loss of RF pulses before entering the scanning region of the imaging device (e.g., the MR scanner 110). The input energy of RF pulses and the reflection energy of RF pulses may be determined based on the second parameter relating to the pulse sequence. The input energy may be determined based on the emission voltage of RF pulses, an emission frequency of RF pulses, and a forward transmission coefficient. The reflection energy may be determined based on the input energy and the reflection coefficient.

In some embodiments, the second parameter may relate to the first parameter of the pulse sequence, a characteristic of the object (e.g., weight, scanning portion of the object, etc.), etc. In some embodiments, the second parameter may be determined based on the first parameter of the pulse sequence, a characteristic of the object (e.g., weight, scanning portion of the object, etc.), etc. For example, the second parameter may be determined by calibrating, for example, a central frequency, a reference voltage, etc., according to the first parameter of the pulse sequence, a characteristic of the object (e.g., weight, scanning portion of the object, etc.), etc. As used herein, the second parameter may also be referred to as a calibration parameter relating to the pulse sequence.

The calibration of the second parameter relating to the pulse sequence may optimize parameters associated with the specific situation of the object. The specific situation may include different locations such as different emission coils or receiving coils, different scanning beds, or the like.

In 550, whether the estimated SAR distribution associated with the object meets a condition may be determined. Operation 550 may be performed by the determination module 430. The condition may refer to the object to be scanned being in a safe state. The condition may include a SAR distribution that the object to be scanned is able to endure. The condition may be determined based on the age, height, weight, tolerance capacity of different parts, or the like of the object to be scanned. In the condition, the SAR distribution in different parts of a child may be less than or equal to the SAR distribution in corresponding parts of an adult. For example, a safe SAR for an adult within 6 minutes under common MR scan mode may be no greater than 2 W/kg. A safe SAR for an adult within a short time (e.g., 10 seconds) under common MR scan mode may be no greater than 6 W/kg. A safe SAR for a child may be less than that for an adult. In some embodiments, the condition may be determined statistically. For example, the condition may be an average SAR distribution of SAR distributions associated with a plurality of historical object samples.

In some embodiments, the determination module 430 may compare the estimated SAR distribution associated with the object with the condition. The determination module 430 may also determine whether the SAR distribution associated with the object meets the condition according to a result of the comparison. Whether the SAR distribution associated with the object meets the condition may indicate that both the overall SAR distribution and the local SAR distribution meet the condition. For example, if a part of the object to be scanned does not meet the condition, the SAR distribution associated with the object to be scanned may be determined to fail to meet the condition. In response to the determination that the SAR distribution associated with the object meets the condition, process 500 may proceed to 560. In response to the determination that the SAR distribution associated with the object fails to meet the condition, process 500 may proceed to 570.

In 560, an MR scan may be performed on the object according to the pulse sequence. Operation 560 may be performed by the MR scanner 110. In some embodiments, in response to the determination that the SAR distribution associated with the object meets the condition, the MR scanner 110 may perform an MR scan on the object according to the first parameter of the pulse sequence to obtain an MR image of the object. This makes it possible to perform safe monitoring on children during MR scan, extending pathological examination methods for children.

In 570, the first parameter of the pulse sequence may be adjusted. Operation 570 may be performed by the processing module 420. In some embodiments, in response to the determination that the SAR distribution associated with the object does not meet the condition, the processing module 420 may adjust the first parameter of the pulse sequence to be applied. The pulse sequence obtained in 520 may be determined as an unsafe pulse sequence when the SAR distribution associated with the object does not meet the condition. The unsafe pulse sequence may bring risks to the object to be scanned and may be forbidden from being applied to the object.

In some embodiments, the processing module 420 may adjust the first parameter of the pulse sequence to be applied based on the condition and the SAR distribution. For example, the processing module 420 may compare the pulse sequence obtained in 520 with the condition to determine the difference between the SAR distribution under the pulse sequence and the SAR distribution under a safe pulse sequence that meets the condition. The adjustment to the first parameter of the pulse sequence may be determined based on the comparison result. The first parameter of the pulse sequence may include TR, FA, or the like. As another example, the processing module 420 may determine a reference SAR distribution that meets the condition as the SAR distribution associated with the object. The processing module 420 may further adjust the first parameter of the pulse sequence based on the reference SAR distribution.

In some embodiments, after the processing module 420 adjusts the first parameter of the pulse sequence (also referred to herein as the adjusted pulse sequence), process 500 may return to 540 to estimate an updated SAR distribution associated with the object under the adjusted pulse sequence to be applied. Process 500 may also proceed to 550 to determine whether the estimated SAR distribution meets a condition as described elsewhere in this disclosure. If it is determined that the estimated SAR distribution meets the condition (the "Yes" arrow out of 550), process 500 may proceed to 560, and an MR scan may be performed on the object under the adjusted pulse sequence as described elsewhere in this disclosure. An MR image may also be generated according to the MR scan. On the other hand, if it is determined that the estimated SAR distribution fails to meet the condition (the "No" arrow out of 540), process 500 may again proceed to 570 to adjust the first parameter of the adjusted pulse sequence to be applied. The iteration of operations 540 through 570 may stop when the updated SAR distribution in an iteration meets the condition. According to the adjusted pulse sequence, an MR scan may be performed on the object, and an MR image of the object may be generated.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, in 560, before the MR scan is performed on the object according to the pulse sequence, an instruction relating to whether performing the MR scan according to the pulse sequence may be generated by the processing module 420. A user or operator may confirm the instruction via, for example, the terminal 130. Then, the MR system 100 may perform the MR scan on the object according to the pulse sequence.

Figure 6:
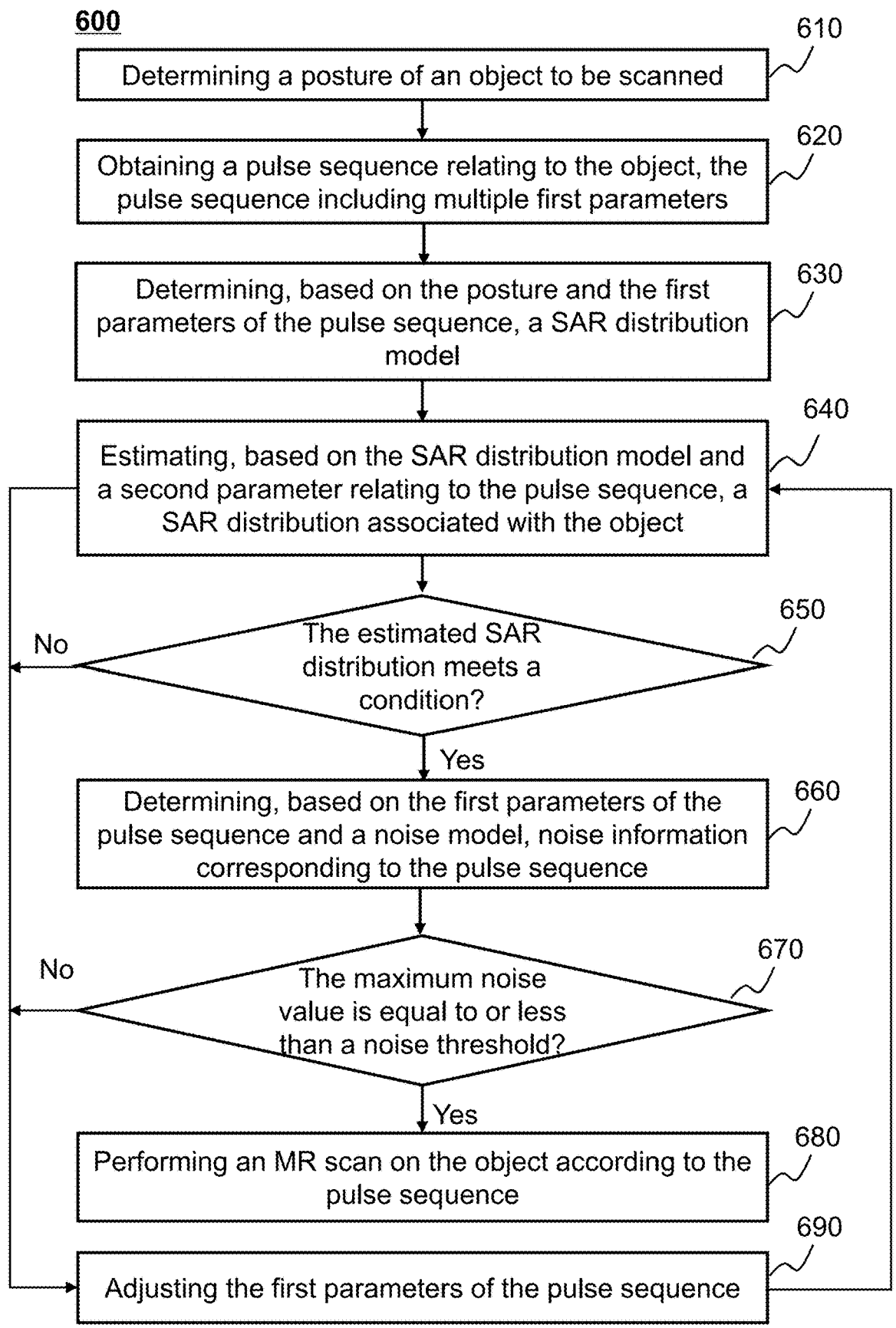
FIG. 6 is a flowchart illustrating an exemplary process for scanning an object using the MRI system according to some embodiments of the present disclosure.

FIG. 6 is a flowchart illustrating an exemplary process 600 for scanning an object using the MRI system according to some embodiments of the present disclosure. The process 600 may be performed in the MRI system 100 illustrated in FIG. 1. For example, the process 600 may be stored in the storage device 150 and/or the storage 220 in the form of instructions (e.g., an application), and invoked and/or executed by the processing device 140 (e.g., the processor 210 illustrated in FIG. 2, or one or more modules in the processing device 140 illustrated in FIG. 4). The operations of the illustrated process presented below are intended to be illustrative. In some embodiments, the process 600 may be accomplished with one or more additional operations not described, and/or without one or more of the operations discussed. Additionally, the order in which the operations of the process 600 as illustrated in FIG. 6 and described below is not intended to be limiting.

In 610, a posture of an object to be scanned may be determined. Operation 610 may be performed by the acquisition module 410.

In 620, a pulse sequence may be obtained, which may include multiple first parameters and relate to the object. Operation 640 may be performed by the acquisition module 410.

In 630, a SAR distribution model may be determined based on the posture and the multiple first parameters of the pulse sequence. Operation 630 may be performed by the processing module 420.

In 640, a SAR distribution associated with the object under the pulse sequence may be estimated based on the SAR distribution model and a second parameter relating to the pulse sequence. Operation 640 may be performed by the processing module 420.

In 650, a determination may be made as to whether the estimated SAR meets a condition. Operation 650 may be performed by the determination module 430. If the estimated SAR meets the condition, process 600 may proceed to 660. If the estimated SAR does not meet the condition, process 600 may proceed to 690. Operations 610-650 may be performed according to operations 510-550 respectively as descried in connection with FIG. 5.

In 660, noise information corresponding to the pulse sequence may be determined based on the first parameters of the pulse sequence and a noise model. Operation 660 may be performed by the processing module 420. The noise information corresponding to the pulse sequence may refer to noises generated by pulse signals or RF signals (i.e., RF pulses). Factors associated with the safety of the object to be scanned may include both the SAR distribution and the noise information corresponding to the pulse sequence. The noise model may represent a relationship between a pulse sequence and noise information corresponding to the pulse sequence. In some embodiments, the processing module 420 may enter the first parameters of the pulse sequence relating to the object into the noise model, and generate the noise information corresponding to the pulse sequence relating to the object. According to the noise information, the processing module 420 may predict real-time noise information to be generated during the scanning. The noise information may include a plurality of noise values. For example, when RF pulses are applied to a scanning region of a medical imaging device (e.g., the MR scanner 110) according to the pulse sequence, a leaning magnetic field with trapezoid waves may be connected or disconnected at a high speed. The noises ranging from 80 dB to 100 dB within the scanning region of the medical imaging device may be generated. The noises may cause negative influence on the object even if the object wears a pair of headsets or earplugs. For example, a child may lose hearing due to the noises.

In some embodiments, the noise model may be obtained from the MR scanner 110, the storage device 150, the storage module 440, or any other external storage. In some embodiments, the noise model may be determined based on a gradient combination model corresponding to the pulse sequence. The gradient combination model corresponding to the pulse sequence may include at least one of a gradient combination model in the aspect of different intensities, a gradient combination model in the aspect of different periods, a gradient combination model in the aspect of different types, or the like, or a combination thereof. For example, a type of the pulse sequence may include a trapezoid pulse, a triangle pulse, etc. The gradient combination model may be a combination of one or more trapezoid pulses, and/or one or more triangle pulses. More descriptions of the gradient combination model may be found elsewhere in this disclosure (e.g., FIGS. 8A-8C and the descriptions thereof).

In some embodiments, the gradient combination model may be obtained from the MR scanner 110, the storage device 150, the storage module 440, or any other external storage. In some embodiments, the gradient combination model may be determined by the processing module 420 via acquiring multiple pulse sequences as samples (also referred herein to as sample pulse sequences) with different gradient combinations. In some embodiments, the processing module 420 may further perform scanning simulations according to the sample pulse sequences with different gradient combinations to acquire noise information corresponding to the sample pulse sequences with different gradient combinations. The noise model may be determined based on the sample pulse sequences with different gradient combinations and the noise information corresponding to the sample pulse sequences. The noise model may be used to output noise information according to a pulse sequence. This may make it possible to accurately predict noise information of the pulse sequence and improve the safety of MR scan on the object.

In 670, a determination may be made as to whether the maximum noise value is equal to or less than a noise threshold. Operation 670 may be performed by the determination module 430. If it is determined that the maximum noise value in the noise information is equal to or less than the noise threshold, process 600 may proceed to 680. If it is determined that the maximum noise value in the noise information is greater than the noise threshold, process 600 may proceed to 690.

In some embodiments, the processing module 420 may determine the maximum noise value in the noise information. The processing module 420 may further compare the maximum noise value in the noise information with the noise threshold. The noise threshold may refer to a noise value safe and acceptable to the object. In some embodiments, the noise threshold may be set by a user via, for example, the terminal 130 or according to a default setting of the MRI system 100. For example, the noise threshold may be determined by the processing module 420 based on the object. The noise threshold for a child may be equal to or less than that for an adult. Merely by way of example, the noise threshold for the adult may be 99 dBA. In some embodiments, the SAR distribution may also be chromatic.

This may be easy to understand and favorable to monitor the SAR distribution associated with the object.

Figure 7:
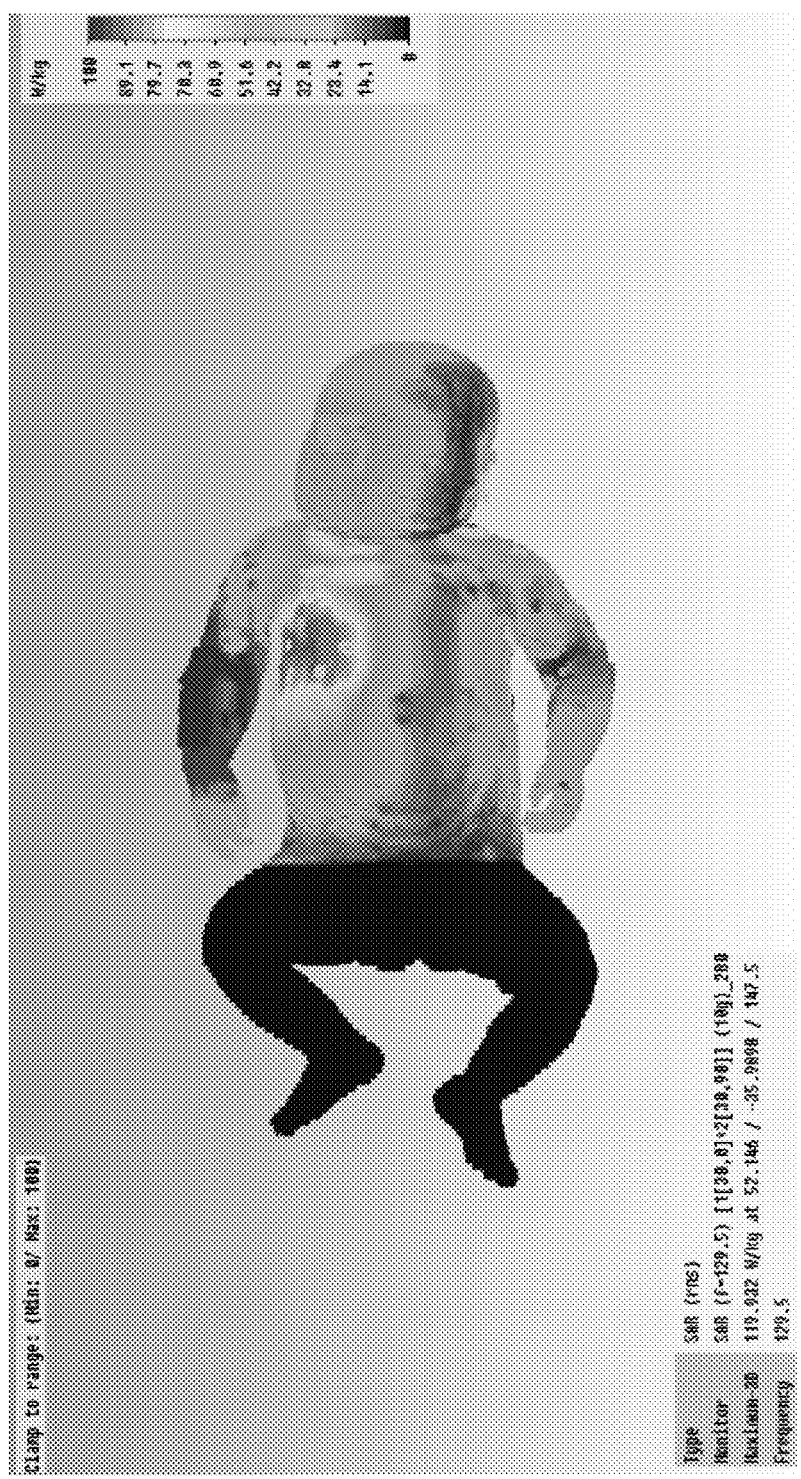
FIG. 7 is a schematic diagram illustrating an exemplary specific-absorption rate distribution associated with a child under MR scan according to some embodiments of the present disclosure.

FIG. 7 is a schematic diagram illustrating an exemplary specific-absorption rate distribution associated with a child under MR scan according to some embodiments of the present disclosure. FIG. 7 may include a 2D image with different grayscales indicating different intensities of the SAR distribution in the body of the child. For example, the SAR distribution in the leg of the child (the darker region) may be lower than the SAR distribution in the right side of chest of the child parts. In some embodiments, the SAR distribution may also be chromatic. This may be easy to understand and favorable to monitor the SAR distribution associated with the object.

Figure 8A:
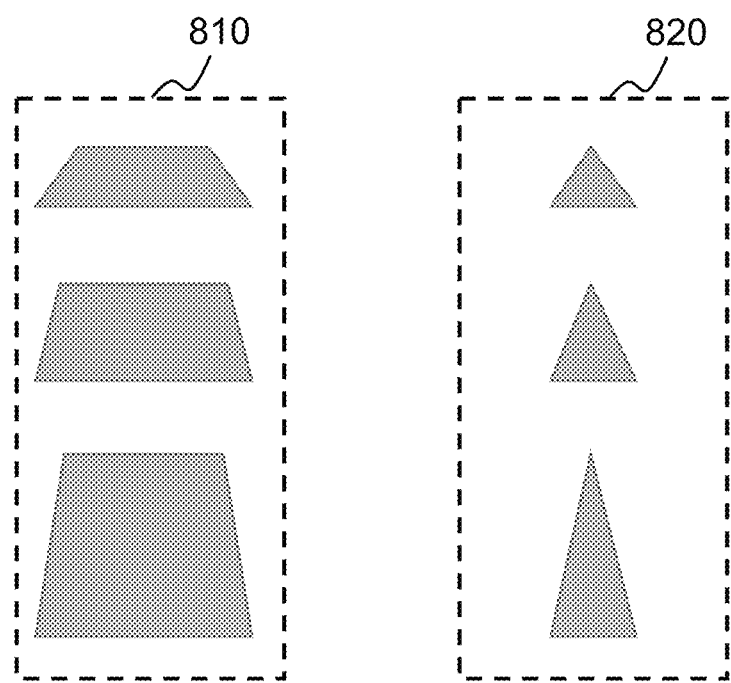
FIG. 8A is a schematic diagram illustrating exemplary pulses with different gradient intensities according to some embodiments of the present disclosure.

FIG. 8A is a schematic diagram illustrating exemplary pulses with different gradient intensities according to some embodiments of the present disclosure. As shown in FIG. 8A, 810 may represent trapezoid pulses with three different gradient intensities, and 820 may represent triangle pulses with three different gradient intensities. The angle between any two lengths of the trapezoid pulse or the triangle pulse may be associated with the gradient intensity. For example, the angle may be proportional to the gradient intensity.

Figure 8B:
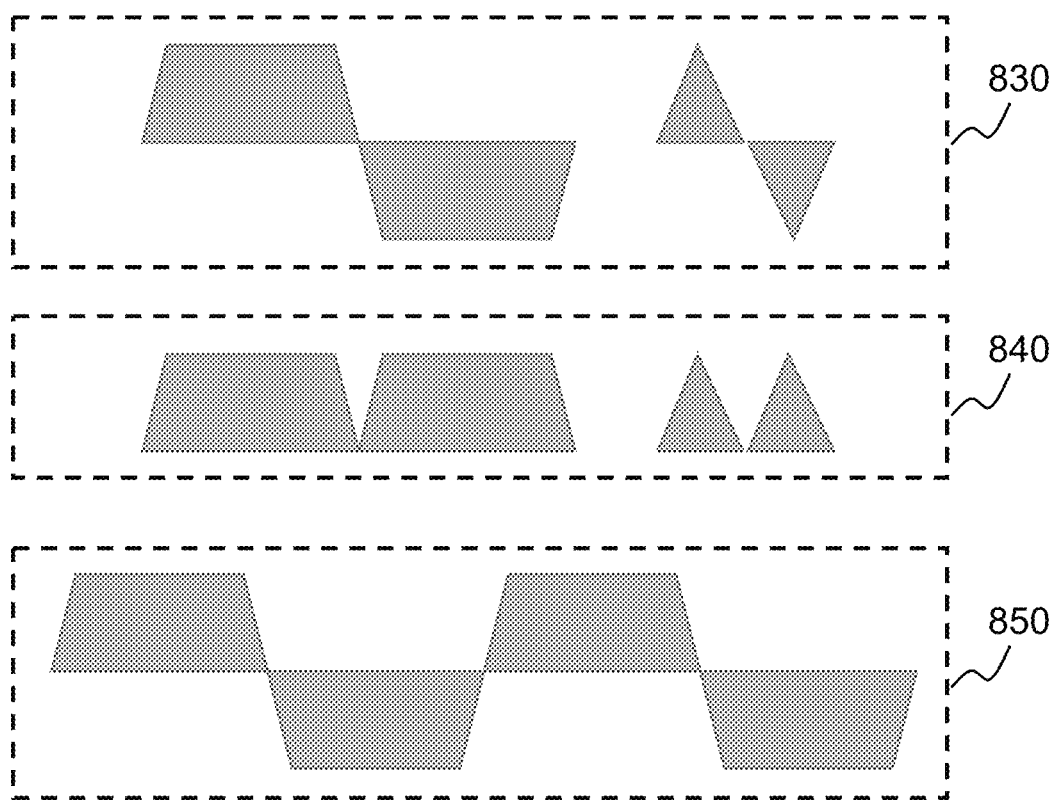
FIG. 8B is a schematic diagram illustrating exemplary gradient combination models with the same gradient intensity and different gradient types according to some embodiments of the present disclosure.

FIG. 8B is a schematic diagram illustrating exemplary gradient combination models with the same gradient intensity and different gradient types according to some embodiments of the present disclosure. The gradient combination model may include a positive-negative gradient combination model, a positive-positive gradient combination model, and an alternative combination model. For example, as shown in FIG. 8B, 830 may represent positive-negative gradient combination models, 840 may represent positive-positive gradient combination models, and 850 may represent an alternative combination model.

Figure 8C:
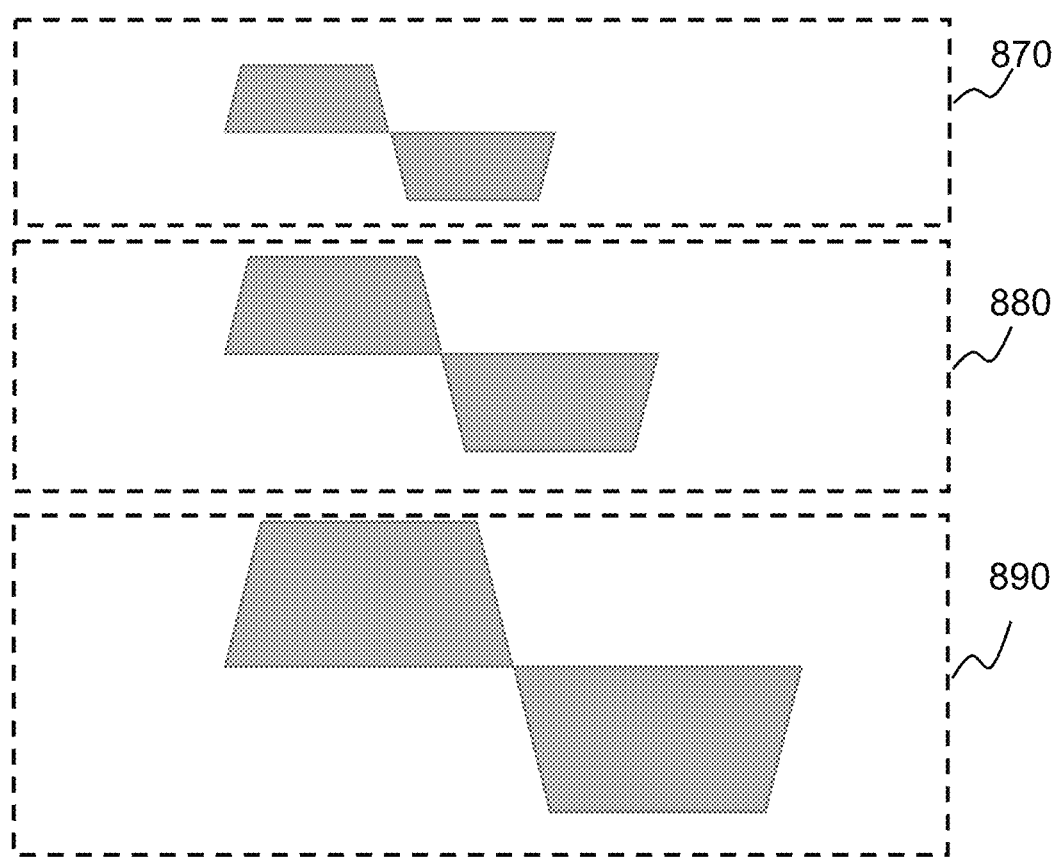
FIG. 8C is a schematic diagram illustrating exemplary gradient combination models with the same gradient intensity and different gradient periods according to some embodiments of the present disclosure.

FIG. 8C is a schematic diagram illustrating exemplary gradient combination models with the same gradient intensity and different gradient periods according to some embodiments of the present disclosure. The lengths of the trapezoid pulse or the triangle pulse may be associated with the gradient period. For example, the lengths of the trapezoid pulse or the triangle pulse may be proportional to the gradient period. As shown in FIG. 8C, the gradient period of 890 may be greater than the gradient periods of 870 and 880.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof to streamline the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A system, comprising:
   a storage device storing a set of instructions; and
   one or more processors in communication with the storage device, wherein when executing the set of instructions, the one or more processors are configured to cause the system to:
   obtain an image of an object positioned on a scanning bed;
   determine, based on the image, a posture of the object;
   obtain a first parameter of a pulse sequence to be applied to the object, the first parameter relating to radio frequency (RF) pulses applied to scan the object;
   determine, based on the posture and the first parameter of the pulse sequence to be applied, a specific-absorption rate (SAR) distribution model, wherein the SAR distribution model represents ratios of SARs with respect to different portions of the object to a total energy of the RF pulses;
   determine the total energy of the RF pulses based on a second parameter relating to the pulse sequence that is calibrated based on the first parameter and a characteristic of the object;
   estimate, based on the SAR distribution model and the total energy of the RF pulses, a SAR distribution associated with the object under the pulse sequence to be applied;
   determine whether the estimated SAR distribution associated with the object meets a condition;
   determine, in response to a determination that the estimated SAR distribution associated with the object under the pulse sequence meets the condition, noise information corresponding to the pulse sequence to be applied based on the first parameter of the pulse sequence;
   determine whether a maximum noise value in the noise information is equal to or less than a noise threshold;
   adjust, in response to a determination that the maximum noise value in the noise information exceeds the noise threshold, the pulse sequence based on the noise information until an energy of the adjusted pulse sequence is less than a predetermined energy threshold and a maximum noise value of the adjusted pulse sequence is equal to or less than the noise threshold; and
   perform a magnetic resonance imaging (MRI) scan on the object according to the adjusted pulse sequence.

2. The system of claim 1, wherein the one or more processors are further configured to cause the system to:
   adjust, in response to a result of the determination that the estimated SAR distribution associated with the object does not meet the condition, the first parameter of the pulse sequence to be applied; and
   re-determine the SAR distribution associated with the object under the adjusted pulse sequence to be applied.

3. The system of claim 1, wherein the one or more processors are further configured to cause the system to:
   determine, based on the first parameter of the pulse sequence to be applied and a noise model, the noise information of the pulse sequence to be applied.

4. The system of claim 1, wherein the one or more processors are further configured to cause the system to:
   adjust, in response to a result of the determination that the maximum noise value in the noise information is greater than the noise threshold, the first parameter of the pulse sequence to be applied based on a difference between the maximum noise value in the noise information and the noise threshold; and
   re-determine the noise information of the adjusted pulse sequence to be applied.

5. The system of claim 3, wherein the noise model is determined based on a gradient combination model of the pulse sequence to be applied, and the gradient combination model including at least one of:
   a gradient combination model in aspect of different intensities, a gradient combination model in aspect of different periods, or a gradient combination model in aspect of different types.

6. The system of claim 1, wherein the image is acquired under a preliminary pulse sequence, wherein energy of the preliminary pulse sequence is less than the energy threshold.

7. The system of claim 1, wherein to determine a specific-absorption rate (SAR) distribution model, the one or more processors are configured to cause the system to select, based on the posture of the object and the first parameter of the pulse sequence to be applied, the SAR distribution model from a SAR distribution database.

8. The system of claim 7, wherein the one or more processors are further configured to cause the system to:
  determine a plurality of object samples having different ages and/or different postures;
  perform, according to a plurality of pulse sequences, a plurality of scanning simulations on the plurality of object samples; and
  determine, based on the plurality of scanning simulations, the SAR distribution database, the SAR distribution database including one or more SAR distribution models.

9. The system of claim 1, wherein the first parameter of the pulse sequence to be applied includes at least one of repetition of time (TR) or flip angle (FA).

10. The system of claim 1, wherein the pulse sequence to be applied includes at least one of a trapezoid pulse or a triangle pulse.

11. A method for magnetic resonance imaging (MRI) scanning implemented on a computing device having a storage device and one or more processors, comprising:
  obtaining, by the one or more processors, an image of an object positioned on a scanning bed;
  determining, by the one or more processors, a posture of the object based on the image;
  obtaining, by the one or more processors, a first parameter of a pulse sequence to be applied to the object, the first parameter relating to radio frequency (RF) pulses applied to scan the object;
  determining, by the one or more processors, based on the posture and the first parameter of the pulse sequence to be applied, a specific-absorption rate (SAR) distribution model, wherein the SAR distribution model represents ratios of SARs with respect to different portions of the object to a total energy of the RF pulses;
  determining, by the one or more processors, based on a second parameter of the pulse sequence that is calibrated based on the first parameter and a characteristic of the object, the total energy of the RF pulses;
  estimating, by the one or more processors, based on the SAR distribution model and the total energy of the RF pulses, a SAR distribution associated with the object under the pulse sequence to be applied;
  determining, by the one or more processors, whether the estimated SAR distribution associated with the object meets a condition;
  determining, by the one or more processors in response to a determination that the estimated SAR distribution associated with the object under the pulse sequence meets the condition, noise information corresponding to the pulse sequence to be applied based on the first parameter of the pulse sequence;
  determining, by the one or more processors, whether a maximum noise value in the noise information is equal to or less than a noise threshold;
  adjusting, by the one or more processors in response to a determination that the maximum noise value in the noise information exceeds the noise threshold, the pulse sequence based on the noise information until an energy of the adjusted pulse sequence is less than a predetermined energy threshold and a maximum noise value of the adjusted pulse sequence is equal to or less than the noise threshold; and
  causing, by the one or more processors, a scanner to perform a magnetic resonance imaging (MRI) scan on the object according to the adjusted pulse sequence.

12. The method of claim 11, further comprising:
  adjusting, by the one or more processors, in response to a result of the determination that the estimated SAR distribution associated with the object does not meet the condition, the first parameter of the pulse sequence to be applied; and
  re-determining, by the one or more processors, the SAR distribution associated with the object under the adjusted pulse sequence to be applied.

13. The method of claim 11, further comprising:
  determining, by the one or more processors, based on the first parameter of the pulse sequence to be applied and a noise model, the noise information of the pulse sequence to be applied.

14. The method of claim 11, further comprising:
  adjusting, by the one or more processors, in response to a result of the determination that the maximum noise value in the noise information is greater than the noise threshold, the first parameter of the pulse sequence to be applied based on a difference between the maximum noise value in the noise information and the noise threshold; and
  re-determining, by the one or more processors, the noise information of the adjusted pulse sequence to be applied.

15. The method of claim 13, wherein the noise model is determined based on a gradient combination model of the pulse sequence to be applied, and the gradient combination model including at least one of:
  a gradient combination model in aspect of different intensities,
  a gradient combination model in aspect of different periods, or
  a gradient combination model in aspect of different types.

16. The method of claim 11, wherein the image is acquired under a preliminary pulse sequence, wherein energy of the preliminary pulse sequence is less than the energy threshold.

17. The method of claim 11, wherein determining a specific-absorption rate (SAR) distribution model further includes selecting, based on the posture of the object and the first parameter of the pulse sequence to be applied, the SAR distribution model from a SAR distribution database.

18. The method of claim 17, further comprising:
  determining, a plurality of object samples having different ages and/or different positions;
  performing, according to a plurality of pulse sequences, a plurality of scanning simulations on the plurality of object samples; and
  determining, based on the plurality of scanning simulations, the SAR distribution database, the SAR distribution database including one or more SAR distribution models.

19. The method of claim 11, wherein the first parameter of the pulse sequence to be applied includes at least one of repetition of time (TR) or flip angle (FA).

20. A non-transitory computer-readable medium comprising executable instructions that, when executed by a computing device, cause the computing device to:
- obtain an image of an object positioned on a scanning bed;
- determine, based on the image, a posture of the object;
- obtain a first parameter of a pulse sequence to be applied to the object, the first parameter relating to radio frequency (RF) pulses applied to scan the object;
- determine, based on the posture and the first parameter of the pulse sequence to be applied, a specific-absorption rate (SAR) distribution model, wherein the SAR distribution model represents ratios of SARs with respect to different portions of the object to a total energy of the RF pulses;
- determine the total energy of the RF pulses based on a second parameter of the pulse sequence that is calibrated based on the first parameter and a characteristic of the object;
- estimate, based on the SAR distribution model and the total energy of the RF pulses, a SAR distribution associated with the object under the pulse sequence to be applied;
- determine whether the estimated SAR distribution associated with the object meets a condition;
- determine, in response to a determination that the estimated SAR distribution associated with the object under the pulse sequence meets the condition, noise information corresponding to the pulse sequence to be applied based on the first parameter of the pulse sequence;
- determine whether a maximum noise value in the noise information is equal to or less than a noise threshold;
- adjust, in response to a determination that the maximum noise value in the noise information exceeds the noise threshold, the pulse sequence based on the noise information until an energy of the adjusted pulse sequence is less than a predetermined energy threshold and a maximum noise value of the adjusted pulse sequence is equal to or less than the noise threshold; and
- perform a magnetic resonance imaging (MRI) scan on the object according to the adjusted pulse sequence.

* * * * *